United States Patent [19]
Henningsson et al.

[11] Patent Number: 5,541,811
[45] Date of Patent: Jul. 30, 1996

[54] SHIELDING AND COOLING ARRANGEMENT

[75] Inventors: Bo U. E. Henningsson, Nynäshamn; Stig A. Arvidsson, Tyresö, both of Sweden

[73] Assignee: Telefonaktiebolaget LM Ericsson, Stockholm, Sweden

[21] Appl. No.: 417,905

[22] Filed: Apr. 6, 1995

[30] Foreign Application Priority Data

Apr. 11, 1994 [SE] Sweden .................. 9401203

[51] Int. Cl.⁶ .............. H05K 7/20; H05K 9/00
[52] U.S. Cl. ............. 361/704; 165/80.2; 165/185; 174/16.3; 174/35 R; 257/719; 361/720; 361/818
[58] Field of Search .................. 165/80.2, 80.3, 165/185; 174/16.3, 35 R; 257/718–719, 726–727; 439/70–73; 361/690, 688, 704, 707–711, 714–722, 760, 783, 816, 818, 820

[56] References Cited

U.S. PATENT DOCUMENTS

| 4,625,260 | 11/1986 | Jordan et al. ............... 361/720 |
| 4,758,924 | 7/1988 | Dillon et al. . |
| 5,237,486 | 8/1993 | LaPointe et al. . |
| 5,253,144 | 10/1993 | Schönberger et al. . |
| 5,295,043 | 3/1994 | Beijer ............... 361/704 |
| 5,357,404 | 10/1994 | Bright et al. ............... 361/818 |

FOREIGN PATENT DOCUMENTS

| 0380740 | 8/1990 | European Pat. Off. . |
| 3737009 | 12/1988 | Germany . |
| 3177095 | 8/1991 | Japan ............... 361/720 |
| 6112674 | 4/1994 | Japan ............... 361/720 |

OTHER PUBLICATIONS

IBM Tech Discl. Bulletin "PIN–In–Heat Sink Attachment", vol. 33, No. 3, Aug. 1990, pp. 447–448, 257/718.

*Primary Examiner*—Gregory D. Thompson
*Attorney, Agent, or Firm*—Burns, Doane, Swecker & Mathis, L.L.P.

[57] ABSTRACT

An arrangement for shielding and/or cooling electronic components mounted on a circuit board includes a generally planar shielding hood and cooling elements. The shielding hood has downward extending side edges that extend around the perimeter and are intended to surround the component. Each cooling element has a generally planar underside and cooling fins disposed on the upper side. The arrangement also includes hook fasteners mounted on the surface of the circuit board and holders mounted on the cooling elements that coact with the hook fasteners. The hook fasteners press the cooling elements resiliently against the shielding hood and against the component. The holders can be brought into resilient, spring engagement with the hook fasteners. The shielding hood is adapted to the component, and when the component is to be shielded, the shielding hood is placed over the component. The cooling element is also adapted to the component, and when the component is to be cooled, the cooling element is placed either on the component or on the shielding hood over the component.

7 Claims, 2 Drawing Sheets

5,541,811

SHIELDING AND COOLING ARRANGEMENT

BACKGROUND

The present invention relates to an arrangement for shielding and/or cooling electronic components mounted on a circuit board. The arrangement includes a generally planar shielding hood having downwardly extending side edges extending around the perimeter thereof and intended for enclosing the components, and a cooling element having a generally planar underside and cooling fins or flanges arranged on its upper side.

Present day IC-components are becoming more and more integrated and therewith more complex. Furthermore, clock frequencies and power generation constantly increase. Microprocessors are a typical case. Parameters such as heat generation and disturbance sensitivity increase with the increasing complexity of IC-components, necessitating the need to shield and cool said components. At present, there is no effective economic or technical solution which combines these requirements, which in reality contradict one another.

The importance of providing effective screening or shielding of IC-components is reflected among other things in the discussions in present day mass media concerning, for instance, how mobile telephones render diserviceable the electronics of motor vehicles, such as cars. There is therefore a pronounced need of a technically simple and economic shielding/cooling construction which will fullfil simultanoeusly the stringent requirements placed on both these facilities.

SUMMARY

The object of the present invention is to solve the aforesaid problem at low costs, by providing an arrangement which can be used either to solely shield an electronic component or solely cool an electronic component or which can be used to both shield and cool an electronic component in a simple manner and at low cost. This object is achieved by means of an arrangement having the characteristic features set forth in the following claims.

The inventive arrangement functions on the principle that in addition to functioning as a shield, the shielding hood shall also conduct heat to a cooling element. The construction is extremely flexible, and enables the following combinations to be obtained with precisely the same elements: shielding and cooling, solely shielding or solely cooling.

When needing to both cool and shield an electronic component, the shielding hood is used as a cooling means and as a heat conducting means and is placed betwen the heat source, for instance an IC-circuit, and a cooling element. In order not to obtain an excessively large thermal transition resistance, the shielding hood and cooling element must have well-defined abutment surfaces with the heat source. This is achieved by configuring both the shielding hood and the cooling element in a manner appropriate to the purpose intended.

The primary characteristic feature of the invention resides in the ability to combine cooling and shielding.

An embodiment of the invention at present preferred includes significant characteristic features which will now be described in more detail with reference to the accompanying drawings.

DETAILED DESCRIPTION

Figure 1:
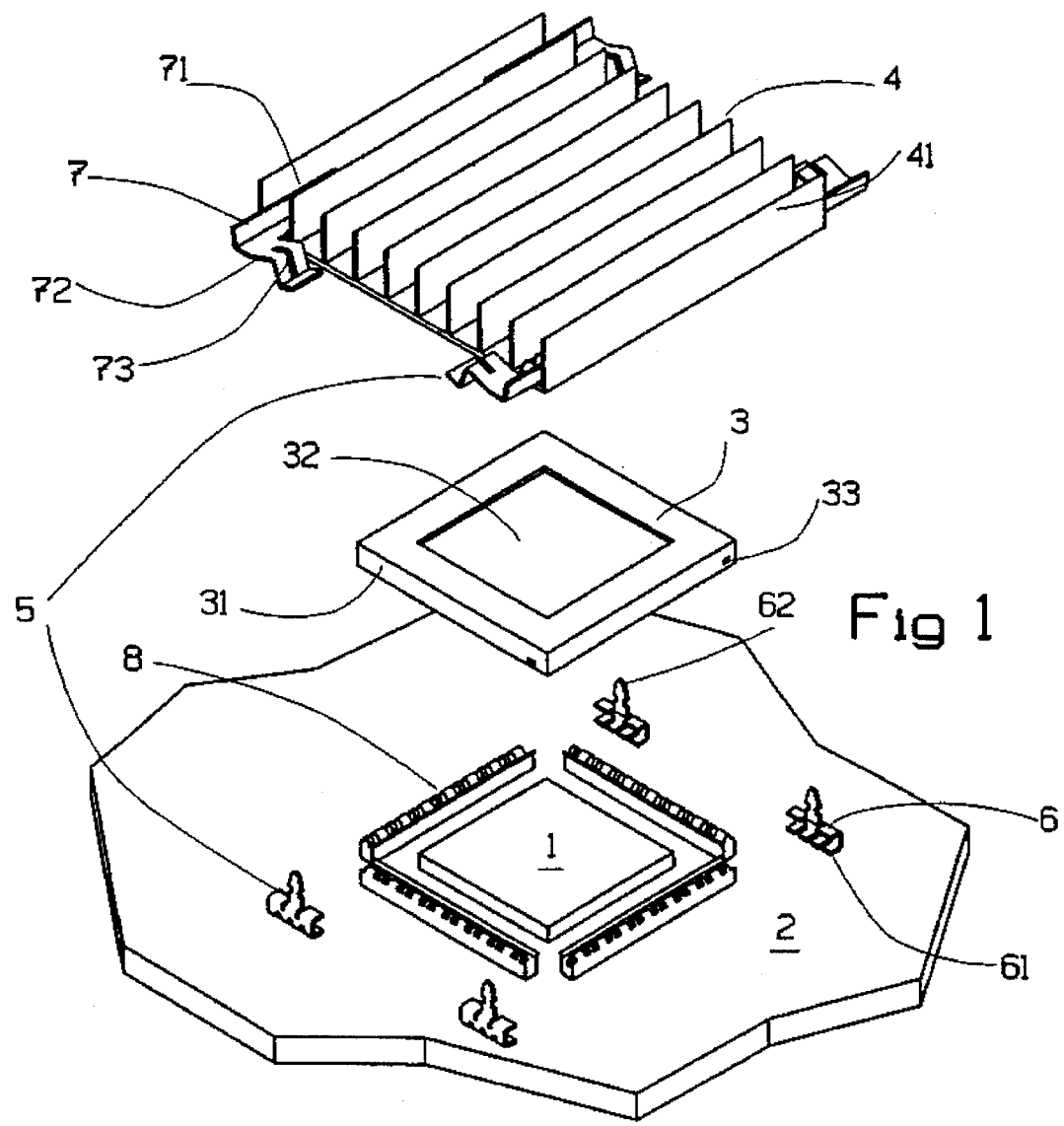
FIG. 1 is a perspective view of the elements included in the inventive arrangement.

FIG. 1 illustrates in perspective those elements which are included in an inventive arrangement. The illustrated arrangement is intended for shielding and/or cooling a component 1, for instance an IC-component, mounted on a circuit board 2. The arrangement includes a generally planar shielding hood 3, a generally planar cooling element 4, fastener means 5 in the form of hook means 6 and holder means 7 respectively, and contact springs 8.

The shielding hood 3 is configured as a substantially rigid frame and has downwardly extending side edges 31 and the size of the hood is adapted to the size of the component 1, so that the component will be fully surrounded by the side edges. The hood 3 is secured to the board 2, by pressing the side edges 31 into contact springs 8 which are surface mounted on the board around the component 1. The side edges include nibs 33 which function to lock the hood firmly in the contact springs. The hood 3 is intended primarily for shielding the component, although it shall also be capable of functioning as a means for conducting heat to the cooling element 4 when the arrangement is also intended for cooling purposes. To this end, it is necessary for the surface of the hood 3 that abuts the component to be well defined, so that the thermal transition resistance will not be too large. Accordingly, the hood has the form of a relatively rigid frame having a thinner central part 32 which is joined to the frame and which can move in relation thereto. The thinner part 32 functions as a movable diaphragm which is pressed against the component 1 with the aid of the cooling element 4. This mobility of the diaphragm enables the height of the hood or cover in relation to the height of the component to be readily adapted so as to ensure that positive abutment is achieved with a small heat transition resistance between component and cooling element, as shown in the sectioned view of FIG. 2.

The heat emitting surface area of the cooling element 4 is enhanced with the aid of a plurality of cooling fins 41 disposed on the upper side of the element. In addition, the cooling element 4 has a well defined abutment surface corresponding to the shielding hood 3, so as to reduce the resistance to thermal transition or transfer. As shown in the sectioned view of FIG. 2, the underside of the cooling element 4 has a downwardly directed, flat outwardly projecting part 42 which may either lie against the central part, the diaphragm 32, of the hood 3 when both shielding and cooling are required, or directly against the component 1 when only cooling is required.

Figure 2:
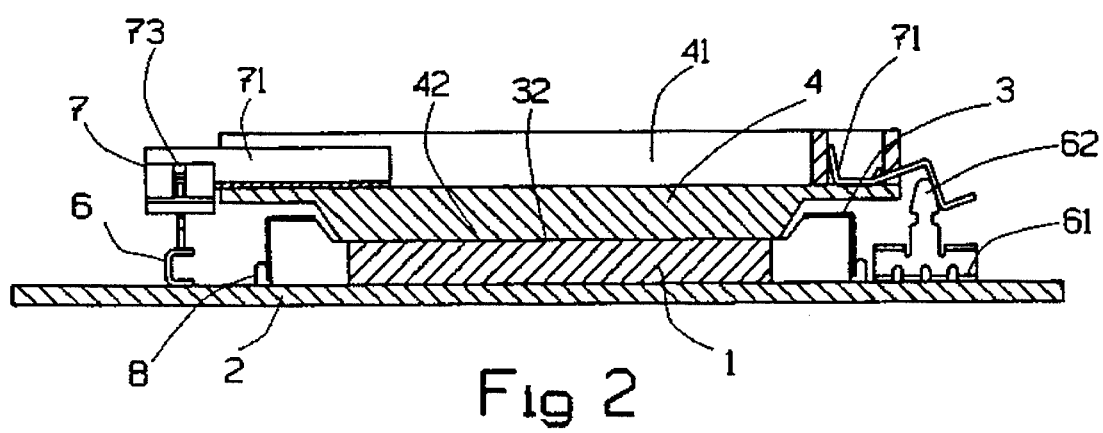
FIG. 2 is a sectional view showing the arrangement mounted over a component.
Figure 6:
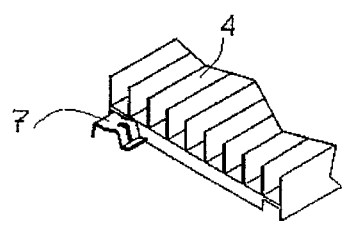
FIG. 6 is an alternative embodiment of the cooling element in which the holder means are placed in grooves.

The cooling element 4 is held in place on the circuit board 2 with the aid of anchoring means 5 which in addition to providing a force which presses the cooling element, and the central part 32 of the hood, against the component also connects the cooling element 4 electrically to earth. In this regard, it is important that the cooling element is connected to earth at each corner. The fastener means 5 are comprised of hook means 6 mounted on the surface of the board 2, and holder means 7, mounted on the cooling element 4, which coact with respective hook means. Each hook means 6 has a generally U-shaped profile, whose one leg has the form of a solder pad 61, said solder pads being soldered to corresponding solder pads (not shown) on the board 2. Each other leg of the profile has the form of a hooked part 62, which is bent so as to be upstanding from the circuit board. The holder means 7 is made of a resilient material having a part 71 configured to enable said part to be clamped firmly between two cooling fins 41 on the cooling element, or, alternatively, in a specially configured groove, as shown in FIG. 6, provided on the cooling element, and a stepped second part 72 in which an opening 73 is provided and which can be brought into resilient or spring engagement with the hooked part 62 of the hook means 6, as illustrated in FIG. 2. A holder means 7 is placed in each corner of the cooling element, and a hook means 6 is placed in a corresponding position on the board 2. The spring effect thus obtained causes the cooling element 4 to be pressed into positive abutment with the shielding hood 3 and the component 1 respectively, which, as before mentioned, ensures good thermal contact between component and cooling element. The cooling element is, at the same time, positively earthed through the holding means 7 and the hook means 6, since anchoring means 5 are placed in each corner.

Figure 3:
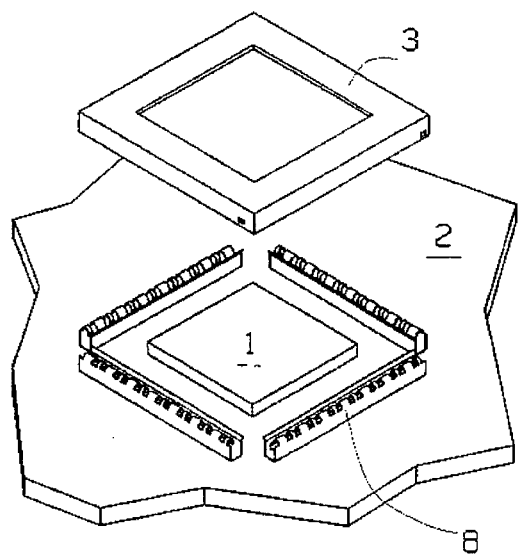
FIGS. 3 and 4 are respective perspective views of the arrangement when used solely for shielding and solely for cooling respectively.

The above described arrangement is used when a component or components is/are to be shielded and cooled. When only shielding is required, only the shielding hood 3 will be used, as illustrated in FIG. 3. The hood is secured in contact springs 8 placed around the component 1 on the circuit board 2 and disposed so that the side edges 31 on the hood 3 will be inserted into the springs 8. This provides effective shielding of the component. The contact springs are also disposed so that the shielding hood 3 will be secured in the springs with the aid of the nibs 33, which are arranged on the sides of the hood in the manner indicated in FIG. 1. The contact spring 8, however, forms no part of the present invention.

Figure 4:
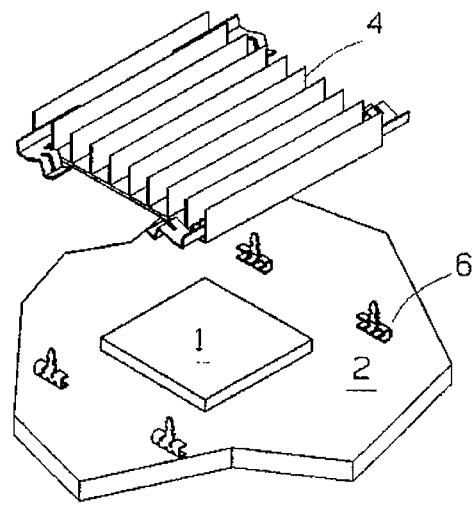

When only cooling is required, the procedure is the same as that described above although in this case only the cooling element 4 is used, as illustrated in FIG. 4. The cooling element 4 is secured with the aid of four fastener means 5, in the same way as that described above.

Figure 5:
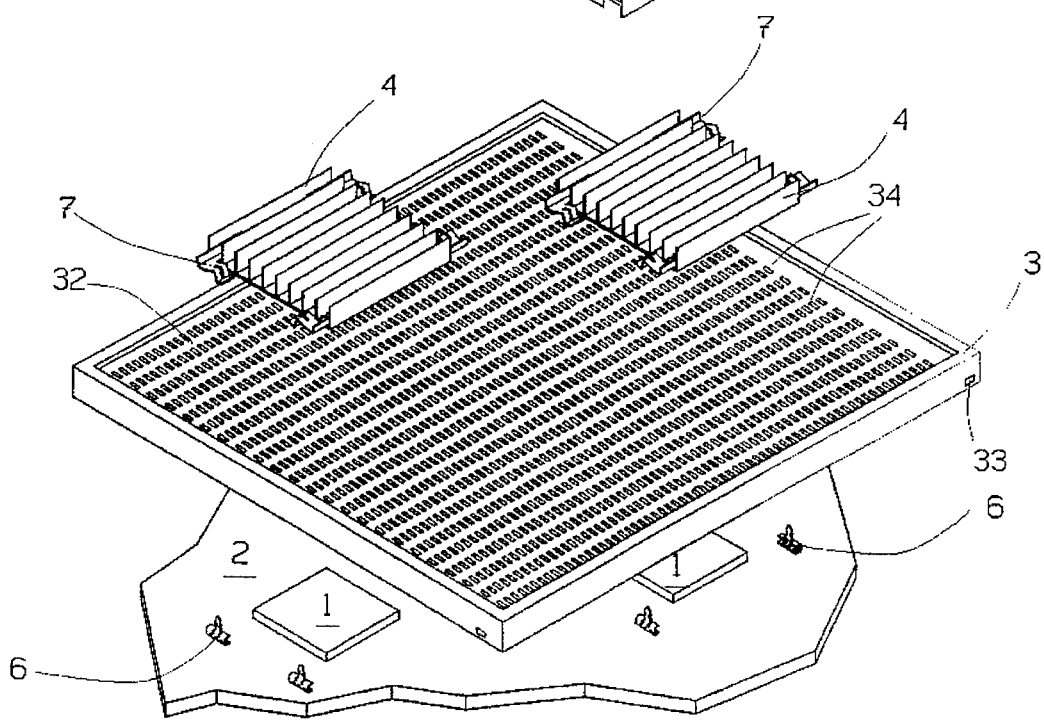
FIG. 5 is an alternative embodiment of an arrangement which is effective for both shielding and cooling purposes.

There is sometimes a need to shield a group of components. This is made possible by the present invention, according to the embodiment shown in FIG. 5, in that the shielding hood 3 is provided in the central part or the diaphragm 32 with a plurality of openings 34 which form a defined hole pattern in the hood, as illustrated in FIG. 5. When requiring to cool a component, a cooling element 4 is placed over the component. The cooling element is affixed with the aid of four fasteners 5, wherein the hook means 6, and more specifically the hooked parts 62, extend up through the opening 34 in the shielding hood 3. In this way, it is possible to arrange one or more cooling elements 4 with associated fasteners 5 on the hood 3, above the component or components 1 that requires/require cooling.

It will be understood that the aforedescribed and illustrated embodiment is merely shown by way of example and that various alternative embodiments are conceivable. For instance the design of both the cooling element 4 and the fastener 5 and associated details can be varied in several ways without departing from the inventive concept.

Consequently, the invention is not restricted to the aforedescribed and illustrated embodiments thereof, since modifications can be made within the scope of the following claims.

What is claimed is:

1. An arrangement for mounting an electronic component on a circuit board, the arrangement comprising:

a generally planar shielding hood having side edges that extend downward around a perimeter of the hood for enclosing a component, wherein the shielding hood is placed over the component to shield the component;

a cooling element having a generally planar underside and cooling fins disposed on an upper side, wherein the cooling element is placed above the component to cool the component; and means for resiliently attaching the cooling element to a surface of the circuit board, wherein the attaching means includes hooks mounted on the surface of the circuit board and holder means, mounted on the cooling element, for coacting with the hooks, wherein the holder means can be brought into resilient engagement with the hooks.

2. The arrangement of claim 1, wherein the shielding hood is a substantially rigid frame having a central thinner part that is adapted to the component and that is in a form of a diaphragm that is movable in relation to a remainder of the shielding hood for causing the component and the cooling element to abut and to ensure good heat transfer between the component and the cooling element.

3. The arrangement of claim 2, wherein the underside of the cooling element has an outwardly projecting part that corresponds in shape to the central thinner part of the shielding hood.

4. The arrangement of claim 1, wherein the shielding hood has a regular pattern of penetrating openings that permit the hooks on the circuit board to extend upward through the openings.

5. The arrangement of claim 4, wherein the shielding hood is placed over a plurality of components, a respective cooling element is placed over each heat-emitting component that requires cooling, said attaching means are provided at each heat-emitting component, and each cooling element is secured by said holder means in engagement with the hooks extending through the openings in the shielding hood.

6. The arrangement of claim 1, wherein the holder means are intended to be clamped in grooves provided in the cooling element or between the cooling fins of the cooling element.

7. The arrangement of claim 1, wherein said attaching means are placed in each corner of the cooling element.

* * * * *